United States Patent
Salinas et al.

(10) Patent No.: US 9,986,653 B2
(45) Date of Patent: May 29, 2018

(54) SHIELDING ARRANGEMENT FOR ENCLOSURES

(71) Applicant: Hoffman Enclosures, Inc., Anoka, MN (US)

(72) Inventors: Octavio Beltran Salinas, Reynosa (MX); Glen Kampa, Anoka, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 0 days. days.

(21) Appl. No.: 15/199,354

(22) Filed: Jun. 30, 2016

(65) Prior Publication Data

US 2017/0006739 A1    Jan. 5, 2017

Related U.S. Application Data

(60) Provisional application No. 62/187,112, filed on Jun. 30, 2015.

(51) Int. Cl.
*H05K 5/00* (2006.01)
*H05K 5/02* (2006.01)

(52) U.S. Cl.
CPC ................... *H05K 5/0213* (2013.01)

(58) Field of Classification Search
CPC .................. G02F 1/133502; G06F 1/1603
USPC .............. 248/906, 918, 297.21; 359/601
See application file for complete search history.

(56) References Cited

U.S. PATENT DOCUMENTS

| | | |
|---|---|---|
| 1,887,088 A | 11/1932 | Frank |
| 1,887,956 A | 11/1932 | Rypinski |
| 2,881,240 A | 4/1959 | Self |
| 2,930,564 A | 3/1960 | Maier |
| 3,381,927 A | 5/1968 | Stamates |
| 3,439,108 A | 4/1969 | Zerwes |
| 3,528,636 A | 9/1970 | Schmidt |
| 3,686,425 A | 8/1972 | Zerwes et al. |
| 3,895,179 A | 7/1975 | Wyatt |
| 3,900,700 A | 8/1975 | Gaudet |
| 4,445,426 A | 5/1984 | Bohanon, Sr. |

(Continued)

FOREIGN PATENT DOCUMENTS

| | | |
|---|---|---|
| CN | 201345784 Y | 11/2009 |
| EP | 1816715 A1 | 8/2007 |

(Continued)

OTHER PUBLICATIONS

International Search Report and Written Opinion for PCT/US16/40507; dated Dec. 2, 2016; 22 pages.

(Continued)

*Primary Examiner* — Steven M Marsh
(74) *Attorney, Agent, or Firm* — Quarles & Brady LLP

(57) ABSTRACT

A apparatus for securing a shield body to one or more enclosures can include a plurality of mounting members configured to retain a plurality of fasteners at any of a plurality of locations along the mounting members. A first set of the mounting members can be secured to a second set of the mounting members, using a first set of the fasteners, at any of a plurality of locations along the mounting members of the first set. One or more enclosures can be secured to the second set of the mounting members, using a second set of the fasteners, at any of a plurality of locations along the mounting members of the second set.

16 Claims, 9 Drawing Sheets

(56) References Cited

U.S. PATENT DOCUMENTS

| | | | |
|---|---|---|---|
| 4,757,967 A | | 7/1988 | Delmore et al. |
| 4,967,990 A | | 11/1990 | Rinderer |
| 5,065,968 A | | 11/1991 | Kesler et al. |
| 5,259,091 A | | 11/1993 | Mordick |
| 5,318,356 A | | 6/1994 | Shelton |
| 5,386,959 A | | 2/1995 | Laughlin et al. |
| 5,435,641 A | | 7/1995 | Dumon et al. |
| 5,521,973 A | | 5/1996 | Peng |
| 6,028,268 A | | 2/2000 | Stark et al. |
| 6,070,957 A | | 6/2000 | Zachrai |
| 6,088,225 A | | 7/2000 | Parry et al. |
| 6,144,418 A | * | 11/2000 | Kappel ................ G02B 27/027 348/834 |
| 6,438,800 B1 | | 8/2002 | Narang et al. |
| 6,723,921 B2 | * | 4/2004 | Vagedes ................ H02G 3/123 174/54 |
| 6,768,071 B1 | | 7/2004 | Gretz |
| 6,879,483 B2 | | 4/2005 | Johnson et al. |
| 6,967,284 B1 | | 11/2005 | Gretz |
| 7,036,782 B2 | | 5/2006 | Cheatham et al. |
| 7,042,731 B2 | | 5/2006 | Schneeberger |
| 7,312,396 B1 | | 12/2007 | Gorman |
| 7,355,118 B1 | | 4/2008 | Gretz |
| 7,388,956 B2 | | 6/2008 | Johnson et al. |
| 7,572,977 B2 | | 8/2009 | Gorman |
| 7,812,254 B2 | | 10/2010 | Wayman et al. |
| 8,107,226 B2 | | 1/2012 | Souligne |
| 8,582,299 B1 | | 11/2013 | Phillips et al. |
| 8,622,358 B2 | * | 1/2014 | Tang ....................... G06F 1/183 248/274.1 |
| 8,787,023 B2 | | 7/2014 | Lewis et al. |
| 1,156,885 A1 | | 12/2014 | Caine |
| RE45,430 E | | 3/2015 | Gorman |
| 2002/0121386 A1 | | 9/2002 | Traut et al. |
| 2003/0020379 A1 | | 1/2003 | Larsen et al. |
| 2004/0007651 A1 | * | 1/2004 | Williams ............. F16M 11/041 248/346.06 |
| 2004/0080244 A1 | | 4/2004 | Lowther et al. |
| 2009/0184072 A1 | | 7/2009 | Fischer et al. |
| 2011/0170808 A1 | | 7/2011 | Chen |
| 2011/0269339 A1 | | 11/2011 | Baran |
| 2012/0145920 A1 | | 6/2012 | Ogawa et al. |
| 2014/0247540 A1 | | 9/2014 | Steeves et al. |

FOREIGN PATENT DOCUMENTS

| | | |
|---|---|---|
| EP | 2747223 A1 | 6/2014 |
| FR | 2896922 A1 | 8/2007 |

OTHER PUBLICATIONS

Hoffman Solar Shield Top catalog page; Copyright 2016 Pentair; <http://www.pentairprotect.com/en/hoffman/ESSH3015>; retrieved from the internet; 1 page.

Pentair Hinge-Cover, Small, Type 3R; Equipment Protection Solutions; <http://www.hoffmanonline.com/stream_document.aspx?rRID=104762&pRID=5778>; retrieved from the interne; 2 pages.

Westell Boxer Solar Shield Kit Installation Guide; Copyright 2012 Westell, Inc.; <http://sitefinity.westell.com/docs/product-documents/bxa-19ss_a90_install.pdf?Status=Master>; retrieved from the internet; 2 pages.

Pilbara SP—Retrofit Sunshades product specification page; <http://esvc001409.wic018u.server-web.com/pdfs/pilbararetrofitsunshades>; retrieved from the internet; 2 pages.

Bison Retrofit Sun Shields; Home Page; Copyright 2011-2016 Bison ProFab; <http://www.bisonprofab.com/retro-fit-sun-shield-kits.htm>; retrieved from the internet; 1 page.

* cited by examiner

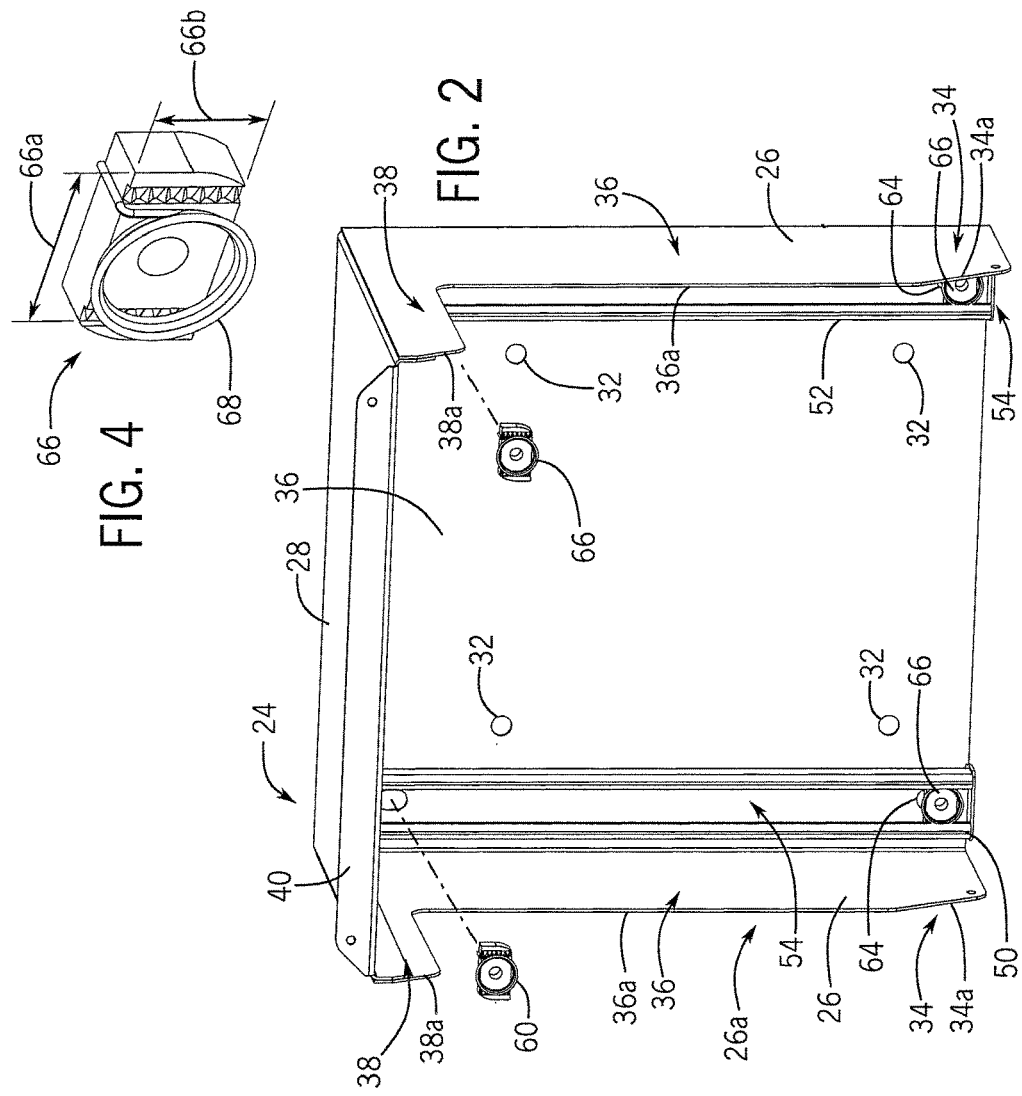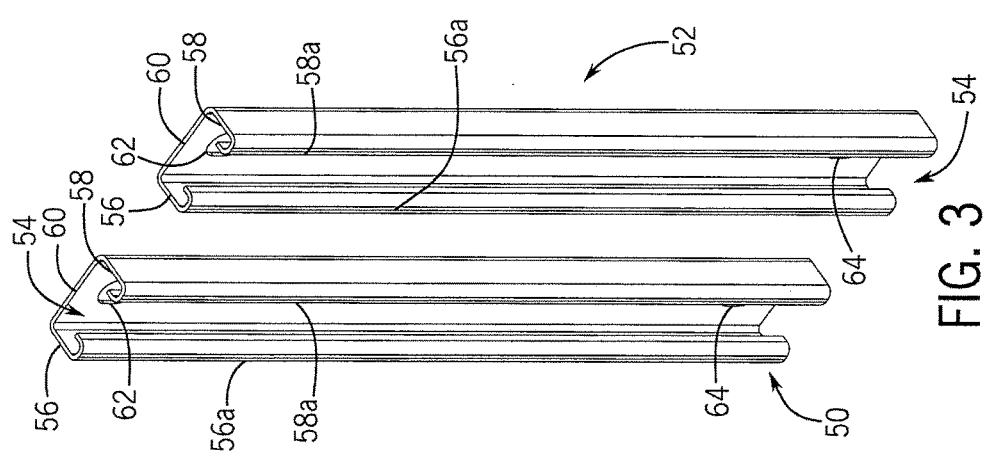

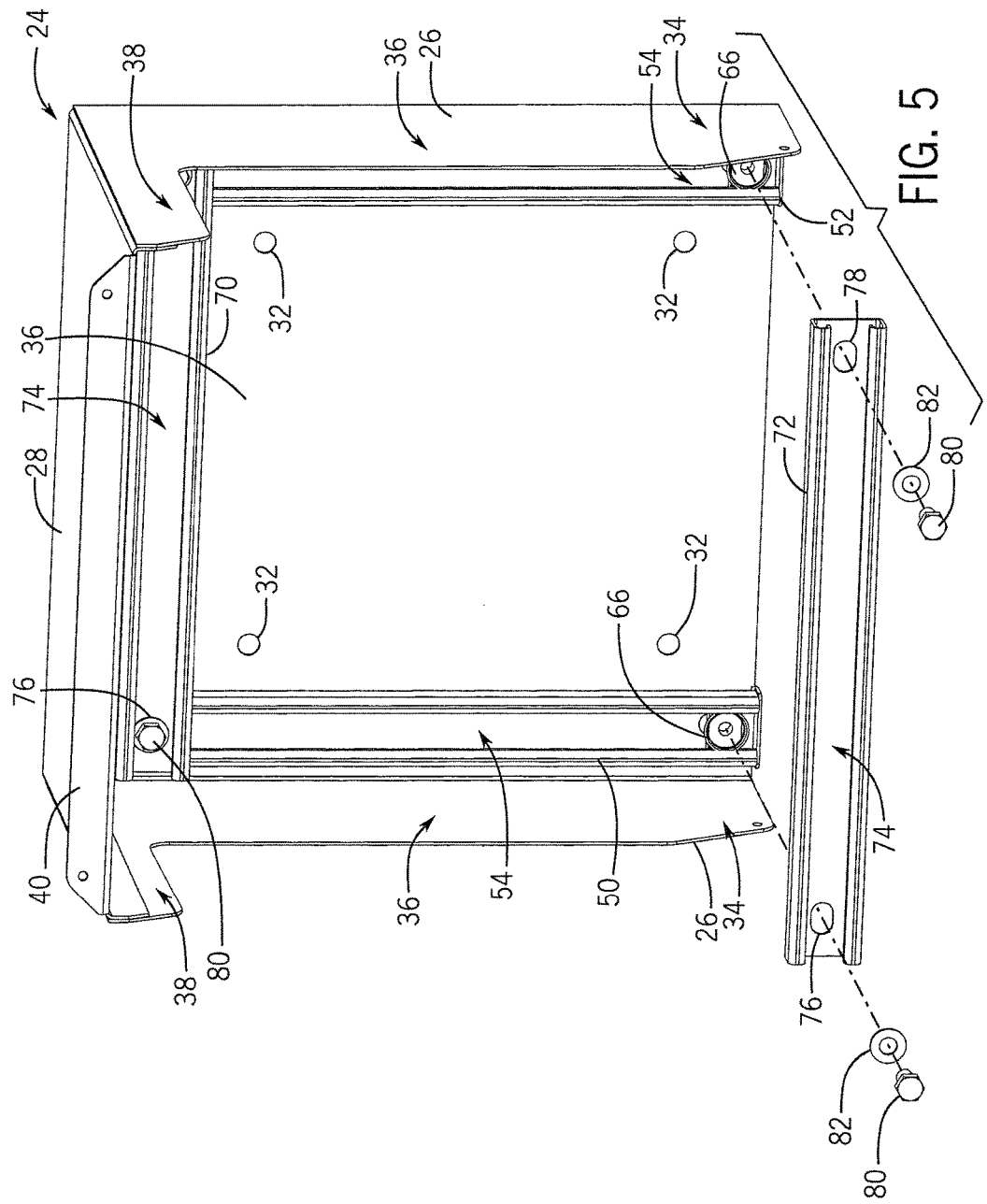

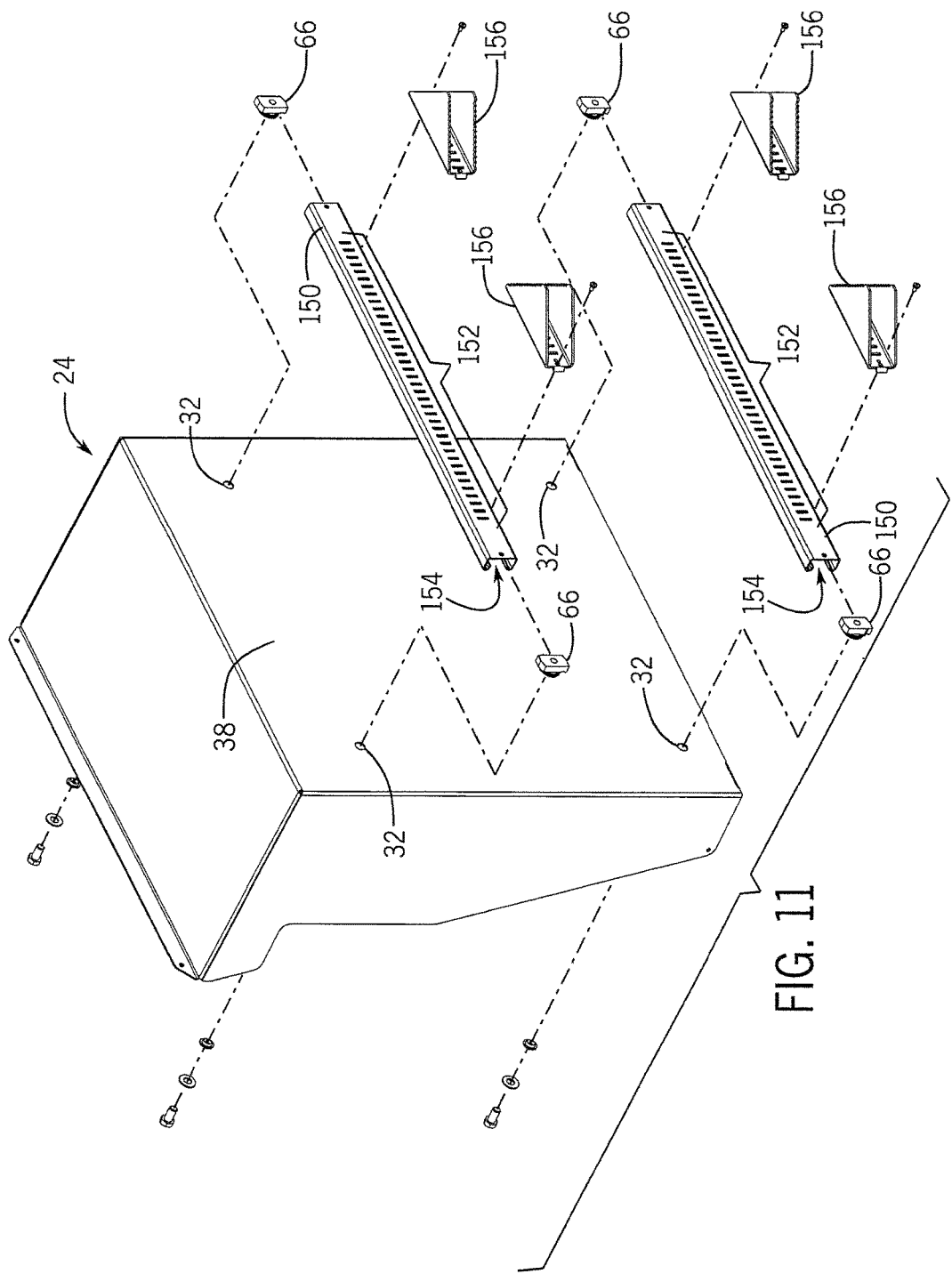

US 9,986,653 B2

SHIELDING ARRANGEMENT FOR ENCLOSURES

RELATED APPLICATIONS

This application claims priority to U.S. Provisional Patent Application No. 62/187,112, which was filed on Jun. 30, 2015.

BACKGROUND

Enclosures, such as those for electrical equipment, are often installed in environments in which exposure to the elements can adversely affect the enclosures and the equipment they contain. For example, enclosures installed in outdoor environments can be exposed to solar radiation, as well as to elements such as rain and snow. This can result in damage or other detrimental effects on equipment contained by the enclosures, including due to elevated temperatures from the solar exposure and to infiltration of water.

SUMMARY

Some embodiments of the invention provide an apparatus for selectively mounting a shield body to one or more enclosures drawn from a group including a first enclosure with first mounting features, and a second enclosure with second mounting features. A plurality of mounting members can include a first base member attachable to the shield body, a second base member attachable to the shield body, a first crossing member, and a second crossing member. First base-member fasteners can be slidably received by the first base member to couple the first crossing member and the second crossing member to the first base member. Second base-member fasteners can be slidably received by the second base member to couple the first crossing member and the second crossing member to the second base member. First crossing-member fasteners can be slidably received by the first crossing member. Second crossing-member fasteners can be slidably received by the second crossing member. The first and second base-member fasteners can be selectively positionable along the first and second base members, respectively, and the first and second crossing-member fasteners can be selectively positionable along the first and second crossing members, respectively, to form: a first arrangement in which the first and second crossing-member fasteners are positioned to secure the apparatus to the first mounting features, and a second arrangement, different from the first arrangement, in which the first and second crossing-member fasteners are positioned to secure the apparatus to the second mounting features.

Some embodiments of the invention provide a apparatus to secure a shield body to different enclosures, including a first enclosure with first mounting features and a second enclosure with second mounting features. Each mounting member of a plurality of mounting members can be configured to retain respective fasteners at any of a respective plurality of locations along the mounting member. A first set of the mounting members can be secured to a second set of the mounting members using a first set of the fasteners retained by the first set of mounting members. The second set of mounting members can retain a second set of the fasteners. A first arrangement of the first set of the fasteners and of the second set of the fasteners, relative to the first set of the mounting members and the second set of mounting members, respectively, can dispose the second set of fasteners to secure the first mounting features to the apparatus.

A second arrangement of the first set of the fasteners and of the second set of the fasteners, relative to the first set of the mounting members and the second set of the mounting members, respectively, can dispose the second set of the fasteners to secure the second mounting features to the apparatus.

Some embodiments of the invention provide a method of securing a shield body to an enclosure, using an apparatus that includes a first set of mounting members, a second set of mounting members, a first set of fasteners, and a second set of fasteners, with each mounting member of the first set of mounting members and the second set of mounting members being configured to retain respective fasteners at any of a respective plurality of locations along the mounting member. The first set of mounting members can be secured to the shield body. The first set of fasteners can be retained along at least one mounting member of the first set of mounting members to provide a first fastener arrangement. The second set of mounting members can be secured to the first set of mounting members using the first set of fasteners in the first fastener arrangement. The second set of fasteners can be retained along at least one mounting member of the second set of mounting embers to provide a second fastener arrangement. At least one of the first enclosure and the second enclosure can be secured to the second set of mounting members using the second set of fasteners in the second fastener arrangement.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 2 is a front, top, right isometric view of the shield body of FIG. 1, showing fasteners being installed on mounting members secured to the shield body;

FIG. 3 is a front, top, right isometric view of the mounting members of FIG. 2;

FIG. 4 is a front, top, right isometric view of one of the fasteners of FIG. 2;

FIG. 5 is a front, top, right isometric view of the shield body of FIG. 1, illustrating additional mounting members being installed on the mounting members of FIG. 2;

FIG. 11 is a rear perspective view of a mounting arrangement for securing the shield body of FIG. 1 to a pole.

DETAILED DESCRIPTION

Figure 1:
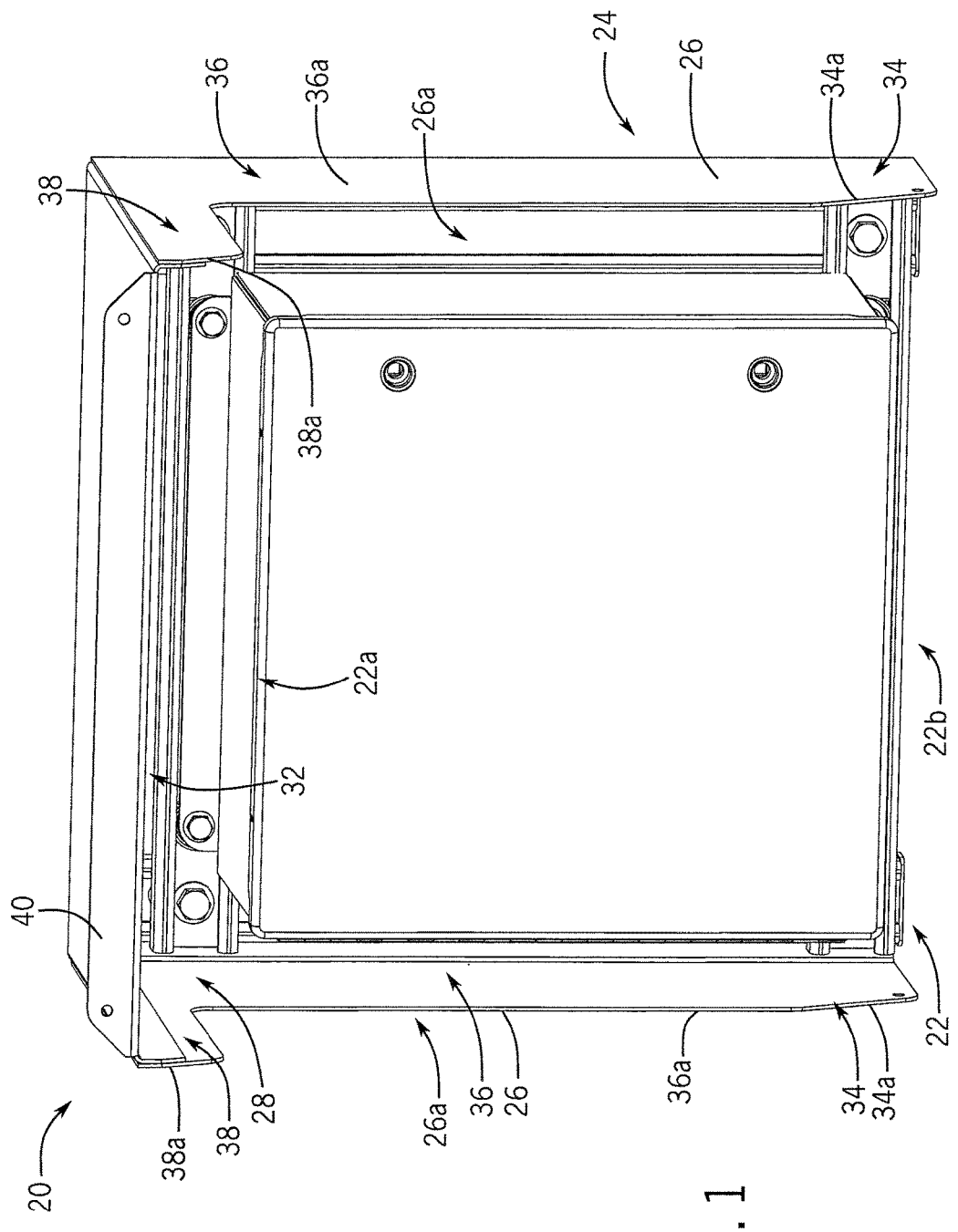
FIG. 1 is a front, top, right isometric view of an enclosure and a shielding arrangement for the enclosure, including a shield body, according to one embodiment of the disclosure.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

As used herein, unless otherwise specified or limited, the phrases "at least one of A, B, and C," "one or more of A, B, and C," and the like, are meant to indicate A, or B, or C, or any combination of A, B, and/or C, including combinations with multiple instances of A, B, and/or C. Likewise, the terms "mounted," "connected," "supported," and "coupled" and variations thereof are used broadly and encompass both direct and indirect mountings, connections, supports, and couplings. Similarly, "connected" and "coupled" are not restricted to physical or mechanical connections or couplings.

Also as used herein, unless otherwise specified or limited, the term "set" refers to a set of one or more of a particular feature or component. For example, a "set of mounting members" can include any non-zero number of mounting members, including a single mounting member. In contrast, for example, a "plural set of mounting members" can include any number of mounting members that is greater than or equal to two.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

A conventional shielding arrangement to protect an enclosure can include multiple individual shield panels, configured for attachment to exterior walls of an enclosure. The panels can be manufactured and installed individually, with different individual panels being separately mounted to respective sides of a given enclosure. Such an arrangement can help to protect an enclosure from some solar heating, but can require time-consuming or otherwise difficult installation. For example, the need to transport, arrange, and install each of the panels separately can require a relatively significant investment of time and effort. This conventional arrangement, and others, can also result in gaps in shielding coverage, including at the joints and corners between enclosure walls.

Conventional shielding arrangements can also offer limited flexibility with regard to the size and type of enclosures to be shielded. For example, conventional shield panels sized to be mounted to, and adequately protect, one enclosure may not be suitable for mounting to and adequately protecting another, differently sized enclosure. Further, conventional arrangements for mounting solar shields (e.g., shield panels) to enclosures can include simple arrays of mounting holes, with fixed spacing between the holes. Because the spacing of mounting holes can vary between different enclosures, adapting a particular shield for multiple enclosures can require the machining of separate sets of mounting holes (or formation of other separate mounting features), even where the shield is otherwise appropriately sized.

Accordingly, a need exists for a shielding arrangement adaptable to protect enclosures of different sizes and mounting configurations. Some embodiments of the invention can address this need, as well as provide various other benefits.

Generally, embodiments of the invention can include a plurality of interchangeable support members, each configured to receive interchangeable fasteners and retain the fasteners at a plurality of locations along the support member. During an installation process, select fasteners can be disposed on a first set of the support members at select locations, and then used to secure a second set of the support members to the first set of the support members. Additional fasteners can then be disposed on the second set of the support members at select locations, and used to secure the second set of support members to an enclosure. As also discussed below, this arrangement can allow for a high degree of customization to accommodate different mounting configurations on different enclosures.

In some embodiments, a shielding arrangement can include first and second sets of support members configured as interchangeable open-channel struts or other channeled members, with a respective channel of each of the support members configured to slidably receive a set of interchangeable spring-biased nuts and to retain one or more of the nuts at a variety of locations along the support member. With this arrangement, a first set of the nuts can be used to attach the first set of support members (e.g., "base" support members) to the second set of support members (e.g., "crossing" support members) at select locations on the first set of support members. Further, a second set of the nuts can be positioned at select locations along the second set of support members, in order to secure the second set of support members to mounting features on a particular enclosure. With the first set of support members secured to a shield body (e.g., of a solar shield), the enclosure can thereby be secured to the shield body. Notably, due to the ability to retain the various fasteners at different locations along the various support members, the arrangement can exhibit a high degree of customizability to accommodate the particular configuration of the mounting features of the enclosure, as well as other mounting configurations on other enclosures.

In some embodiments, the noted arrangement (or other arrangements) of the first and second sets of support members can also provide an air gap between the shield body and an enclosure secured thereto. This can, for example, usefully improve the thermal protection afforded by the shield body by allowing for more effective convective cooling and by eliminating some conductive paths between the shield body and the enclosure.

FIG. 1 illustrates an adjustable shielding arrangement 20 according to one embodiment of the disclosure. In the arrangement illustrated, the shielding arrangement 20 is secured to an enclosure 22, so that the shielding arrangement 20 can shield the enclosure 22 from solar radiation and other environmental factors. Generally, the enclosure 22 is configured to be mounted to a wall or other rigid structure (e.g., an open frame, pole, or other structure), including when the enclosure 22 is installed independently of the shielding arrangement 20. In other arrangements, the adjustable shielding arrangement 20 can be used with other types of enclosures, including free-standing enclosures (not shown).

The shielding arrangement 20 generally includes a shield body 24 to protect the enclosure 22 (or other enclosures) from environmental effects. As also illustrated in FIG. 2, the shield body 24 includes side walls formed from two side panels 26, a top wall formed from a top panel 28, and a rear wall formed from a rear panel 30. The various panels 26, 28, and 30 can be integrally formed with or attached to each other in various ways, so that the shield body 24 exhibits appropriate rigidity and strength. The panels 26, 28, and 30 can be formed from metal, plastic, or other materials, and can be formed in various sizes in order to accommodate larger or smaller enclosures.

The shield body 24 can be configured with various mounting features to secure the shield body (and, in some cases, the enclosure) to a structure such as a wall or an open frame. In the illustrated embodiment, the rear panel 30 includes a number of mounting holes 32 (see FIG. 2) for securing the shield body 24 to a structure. In other embodiments, other mounting features or mounting arrangements can be used.

In the embodiment illustrated, each of the side panels 26 includes a lower angled portion 34 with an edge profile 34a that extends forward and upward from a lower end, a middle portion 36 with an edge profile 36a that extends vertically upward from the upper end of the angled portion 34, and an upper portion 38 with an angled edge profile 38a extending forward and upward from the middle portion 36.

Generally, the upper portion 38 of the side panels 26 extends forward of the middle portion 36 of the side panel 26, and can further extend past a front edge of an enclosure (e.g., a front edge 22a of the enclosure 22, as illustrated in FIG. 1), along with the top panel 28, when the enclosure is secured to the shield body 24. This can be useful, for example, to allow the shield body 24 to shield the top of an enclosure (e.g., the enclosure 22), from the sun, rain, snow and other environmental elements. Further, the forward extension of the edge profile 38a, as well as the contours of the edge profiles 34a and 36a form a cut-out 26a in the side panel 26, relative to a standard rectangular or other quadrilateral panel shape. As also discussed below, this can help to accommodate enclosure doors of different configurations.

Also to protect the enclosure 22 (or other enclosures), a forward end of the upper portion 38 is configured with a lip 40, which can further shield the top of the enclosure 22 by directing rain, snow, and other elements away from the open front of the shield body 24, as well as away from the enclosure 22 generally. Further, the top panel 28 of the shield body 24 angles generally downward, from a perspective moving away from the lip 40. This can further direct environmental elements away from the open front of the shield body 24, as well as away from the enclosure 22 (or other enclosures) generally.

In some embodiments or installations, other parts of the shield body 24 (e.g., the side panels 26 or the rear panel 30) can be extend below a bottom end of an enclosure (e.g., a bottom end 22b of the enclosure 22). This may also help to provide shielding to the entire rear portion of the enclosure 22, as well as relatively large areas on the rear of larger enclosures (not shown).

FIGS. 2 and 3 illustrate mounting members 50 and 52 for use with the shielding arrangement 20. Each of the mounting members 50 and 52 is configured as a strut with an extended mounting channel 54 that is at least partly defined by side walls 56 and 58 and a rear wall 60, and with mounting features configured as mounting slots 62 and 64. The side walls 56 and 58 further includes respective side wall bends 56a and 58a that exhibit u-shaped profiles at the ends of the side walls 56 and 58 to define respective re-entrant lips. Accordingly, the mounting channels 54 are effectively wider near the rear walls 48 than near the bends 56a and 58a, as may be useful for retaining a fastener within either of the mounting channels 54. In other embodiments, other restrictions (e.g., other restrictions in channel width) can be used to similar effect.

FIG. 2, in particular, illustrates the mounting members 50 and 52 installed on the shield body 24. Generally, the mounting members 50 and 52 are installed by being rigidly secured to the shield body 24, so that the respective orientation of each of the mounting members 50 and 52 is fixed with respect to the shield body 24. In the embodiment illustrated, the mounting members 50 and 52 have been welded to the rear panel 30 of the shield in a vertical orientation, at locations that generally adjacent to the side panels 26. In other embodiments, other configurations are possible. For example, fasteners, such as screws and nuts (not shown), can cooperate with the mounting slots 62 and 64 (see also FIG. 3) in order to rigidly secure the mounting members 50 and 52 to the shield body 24 without necessarily requiring welding.

In some embodiments, the mounting members 50 and 52 can be secured to the shield body 24 at other locations or in other orientations. For example, the mounting members 50 and 52 can be secured to the shield body 24 closer to the center of the rear panel 30 than is illustrated in FIG. 2. Similarly, either of the mounting members 50 and 52 can be secured in a horizontal (or other) orientation, rather than the vertical orientation depicted in FIG. 2.

In some embodiments, the mounting members 50 and 52 can be secured to features other than the rear panel 30. For example, the mounting members 50 and 52 can be rigidly secured to the side panels 26 (e.g., still in the vertical orientation depicted in FIG. 2), rather than (or in addition to) being secured to the rear panel 30. As another example, one or both of the mounting members can be secured to the top panel 28 rather than (or in addition to) the rear panel 30.

As also illustrated in FIG. 2, with the mounting members 50 and 52 rigidly secured to the shield body 24, fasteners such as nuts 66 can be seated in the mounting channels 54 of the mounting members 50 and 52. As further illustrated in FIG. 4, in the embodiment illustrated, each of the nuts 66 includes a biasing spring 68, and exhibits a length 66a that is generally larger than a width 66b. The length 66a is also greater that the width of the mounting channels 54 at the bends 56a and 58a of the side walls 56 and 58, but is smaller than the width of the mounting channels 54 near the rear walls 48. Accordingly, the nuts 66 can be inserted into the mounting channels 54, with the length 66a aligned with the axes of the mounting channels 54, rotated 90 degrees to prevent extraction of the nuts 66 laterally past the bends 56a and 58a, then moved within the mounting channels 54 (before or after the noted rotation) to desired mounting locations along the mounting channels 54. Once the nuts 66 are within the channels and disposed at the desired mounting locations, the springs 68 and the re-entrant lips of the mounting channels 54 can help to retain the nuts 66 in place within the channels 54 for further operations.

As also noted above, in some configurations, a first set of mounting members can be used to secure a second set of mounting members to a shielding arrangement. In this regard, for example, a first set of mounting members can serve as a set of "base" members, which can then support further "crossing" members therebetween. In some embodiments, the mounting members of the first set can be substantially identical to the mounting members of the second set, so that the mounting members are generally interchangeable during installation. As one example of an installation process for this type of configuration, FIG. 5 illustrates the use of the nuts 66 to secure additional mounting members 70 and 72 to the mounting members 50 and 52. The mounting members 70 and 72 are generally configured similarly to the mounting members 50 and 52, with mounting channels 74 similar to the mounting channels 54, as well as mounting slots (or other holes) 76 and 78.

In some embodiments, a profile of the mounting channels of a first set of mounting members can be substantially identical to a profile of the mounting channels of a second set of mounting members, while other aspects of the first and second sets (e.g., the length of the various mounting members) varies. With such a configuration, the mounting channels of the first and second sets can accordingly be used interchangeably with respect to a common set of substantially identical (e.g., interchangeable) fasteners, although mounting members of a particular length (e.g., mounting members from only one of the first set or the second set) can be used for particular portions of a particular shielding arrangement.

To secure the mounting members 70 and 72 to the mounting members 50 and 52, a set of the nuts 66 can be disposed at appropriate locations within the mounting channels 54. Additional fasteners, such as screws 80, can then be inserted through the mounting slots 76 and 78 of the mounting members 70 and 72 (and through washers 82) to engage the nuts 66. Tightening the screws 80 can accordingly clamp the side wall bends 56*a* and 58*a* between the nuts 66 and the respective mounting members 70 and 72, so that the mounting members 70 and 72 are rigidly, but removably, secured to the mounting members 50 and 52, and thereby to the shield body 24. Notably, because the nuts 66 can be retained on the mounting members 50 and 52 at essentially any location along the mounting members 50 and 52, the nuts 66 and the mounting members 50 and 52 can be used to secure the mounting members 70 and 72 in any number of relative orientations, as may be appropriate for a particular shielding arrangement (e.g., for protecting a particular enclosure).

In the embodiment illustrated, as also noted above, the mounting members 50 and 52 are secured in a vertical orientation. Correspondingly, the mounting members 70 and 72 are secured in a horizontal orientation. In other embodiments, other configurations are possible. For example, the mounting members 50 and 52 can be secured to the shield body 24 (or another body) in a horizontal orientation, and the mounting members 70 and 72 secured to the mounting members 50 and 52 in a vertical orientation.

Figure 6:
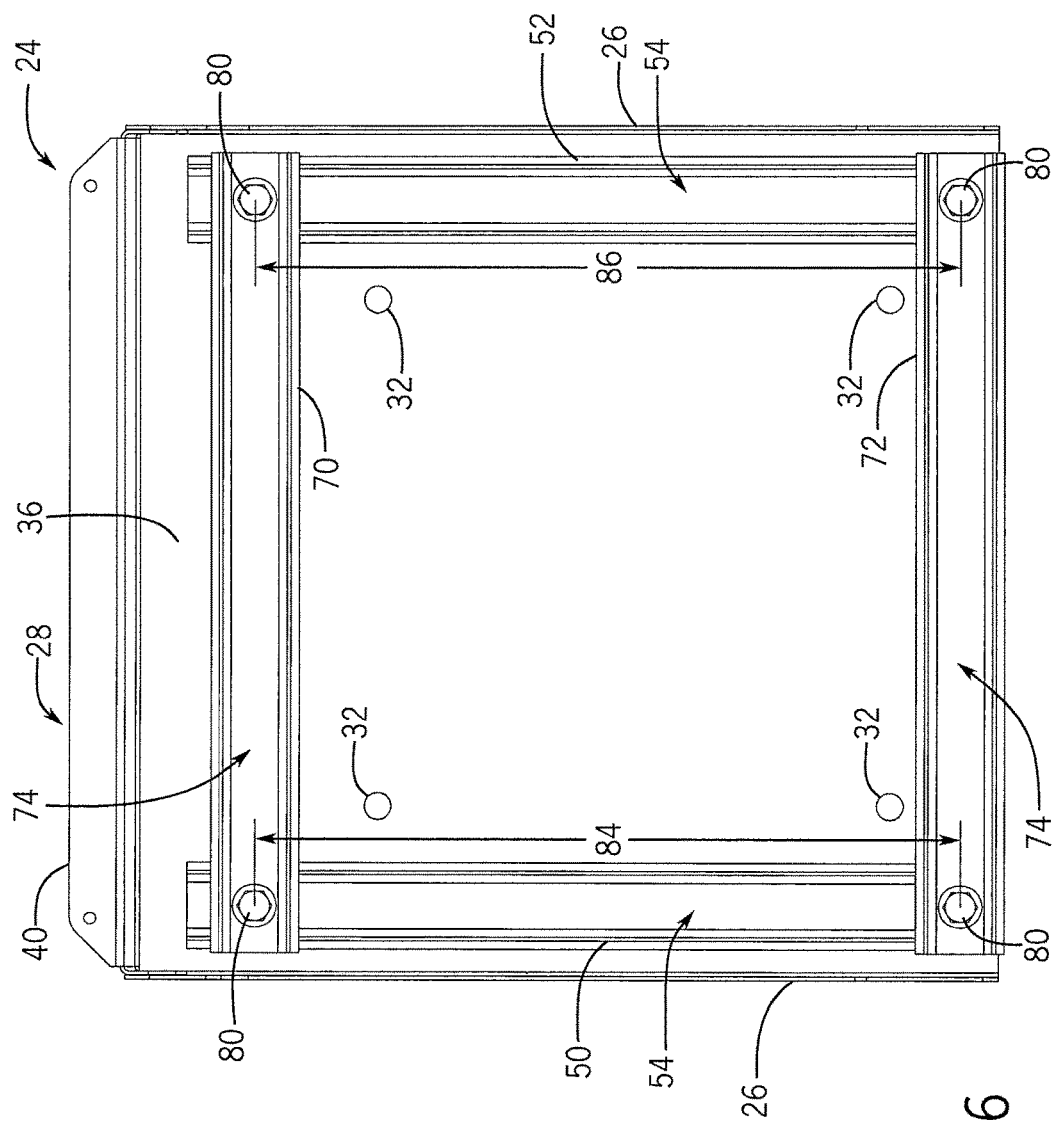
FIG. 6 is a front elevation view of the shield body of FIG. 1, illustrating the additional mounting members of FIG. 5 in one installed configuration.

As also described below, once the mounting members 70 and 72 are secured to the mounting members 50 and 52 (e.g., as described above), the mounting members 70 and 72 can be used to secure a particular enclosure (e.g., the enclosure 22) to the shield body 24. To this end, the nuts 66 in the mounting members 50 and 52 can be disposed to secure the mounting members 70 and 72 to the mounting members 50 and 52 with a vertical spacing between the mounting members 70 and 72 that matches a vertical spacing of mounting features (e.g., mounting holes) on a relevant enclosure. As illustrated in FIG. 6, for example, the mounting members 70 and 72 can be secured to the mounting members 50 and 52 with vertical spacings 84 and 86 at opposite ends of the mounting members 70 and 72 (e.g., as measured from the approximate centerlines of the mounting channels 74). This may be useful, for example, to secure enclosures having similar vertical spacings between mounting features. Notably, however, the spacing between the mounting members 70 and 72 can be selected, through the selection of particular mounting locations for the nuts 66 along the mounting members 50 and 52, to correspond to any number of vertical-spacing arrangements for relevant mounting features. Accordingly, the ability to select any number of mounting locations for the nuts 66 can provide significant flexibility in accommodating different arrangements of mounting features on different enclosures.

For enclosures with mounting features arranged in generally rectangular mounting configurations (e.g., with mounting holes or other mounting features generally arranged at corners of a rectangle), it may be useful for the two vertical spacings 84 and 86 to be substantially equal to each other, as well as substantially equal to a corresponding spacing between the relevant mounting features of the enclosures. In some embodiments, however, the vertical spacing 84 may be different from the vertical spacing 86.

Figure 7:
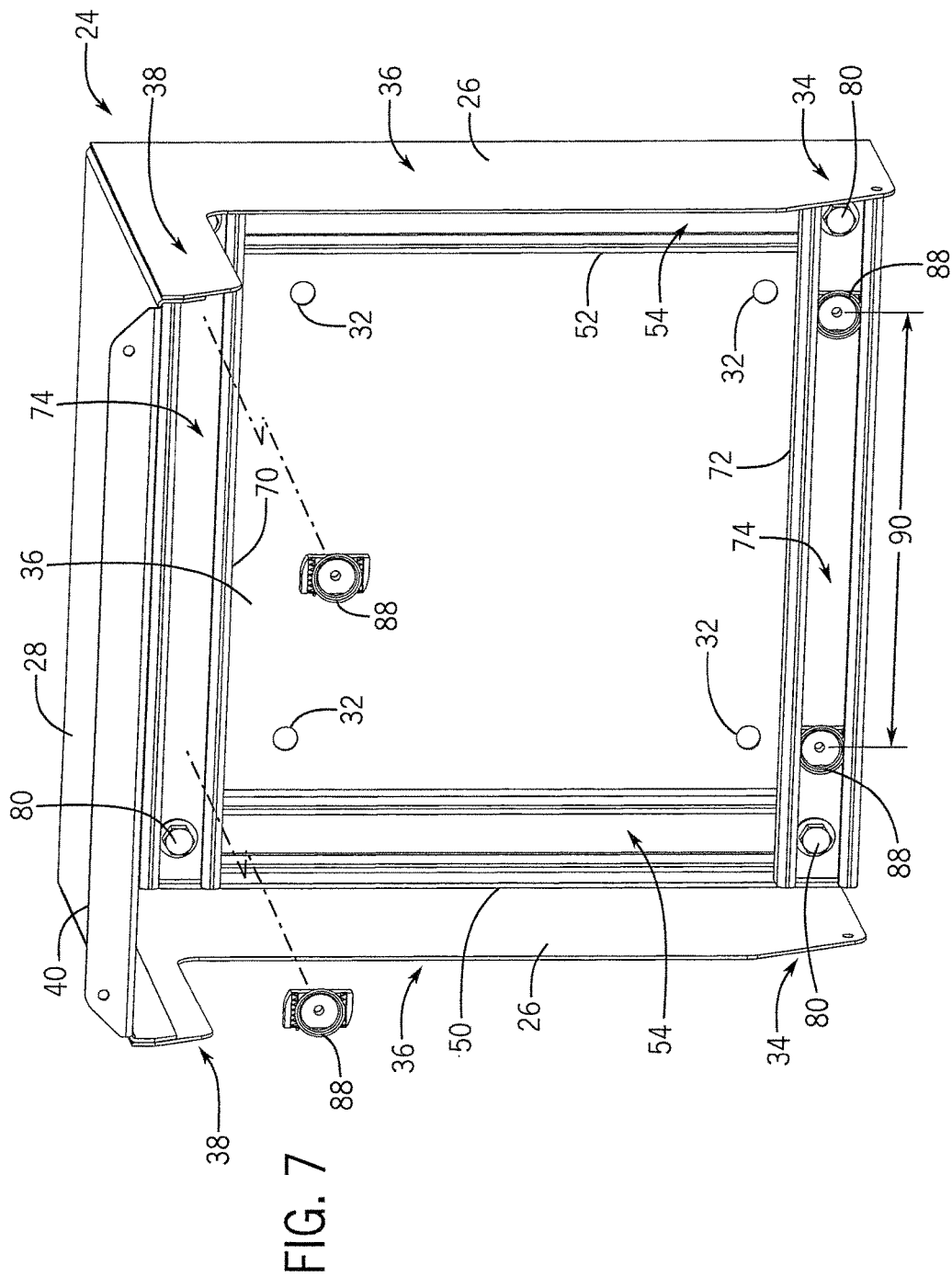
FIG. 7 is a front, top, right isometric view of the shield body of FIG. 1, illustrating additional fasteners being installed on the additional mounting members of FIG. 5.

As illustrated in FIG. 7, once the mounting members 70 and 72 have been secured to the shield body 24 via the mounting members 50 and 52, fasteners such as nuts 88 can be inserted into the mounting channels 74. The nuts 88 can be configured similarly to the nuts 66 (e.g., can be interchangeably identical to the nuts 66), such that the nuts 88 can be inserted into the mounting channels 74, then moved along the mounting channels 74 to appropriate mounting locations before being secured in place.

Generally, the nuts 88 can be used, in conjunction with the mounting members 70 and 72, to secure the shielding arrangement 20 to a particular enclosure (e.g., the enclosure 22). To secure a particular enclosure in place, it may accordingly be useful to align the nuts 88 with appropriate mounting features on the enclosure. In this regard, the ability to select any number of mounting locations for the nuts 88 along the mounting members 70 and 72 can again provide significant flexibility in accommodating different arrangements of mounting features on different enclosures.

FIG. 7 illustrates two of the nuts 88 secured to the mounting member 64 with a horizontal spacing 90 (e.g., as measured between the approximate centers of the nuts 88). For enclosures with mounting features arranged in generally rectangular mounting patterns (e.g., with mounting features generally arranged at corners of a rectangle), it may be useful for a horizontal spacing of the nuts 88, as installed on the mounting member 62 (full installation of the nuts 88 on the mounting member 62 not shown in FIG. 7), to be substantially equal to the spacing 90, as well as substantially equal to a corresponding spacing between the relevant mounting features of the enclosures.

Using the arrangements disclosed herein, effective mounting locations for securing a particular enclosure to a shield body can accordingly be varied to accommodate (e.g., match) a particular configuration of the mounting features on the enclosure. For example, the nuts 66 (see FIG. 2) can be positioned and retained within the mounting channels 54 of the mounting members 50 and 52 so that, when the mounting members 70 and 72 are secured to the nuts 66, the mounting members 70 and 72 exhibit a vertical spacing that corresponds to a vertical spacing of the mounting features of the enclosure. Likewise, the nuts 88 can be positioned and retained within the mounting channels 74 of the mounting members 70 and 72 so that the nuts 88 exhibit a horizontal spacing that corresponds to a horizontal spacing of the mounting features of the enclosure (as well as a vertical spacing determined by the position of the nuts 66).

Figure 8:
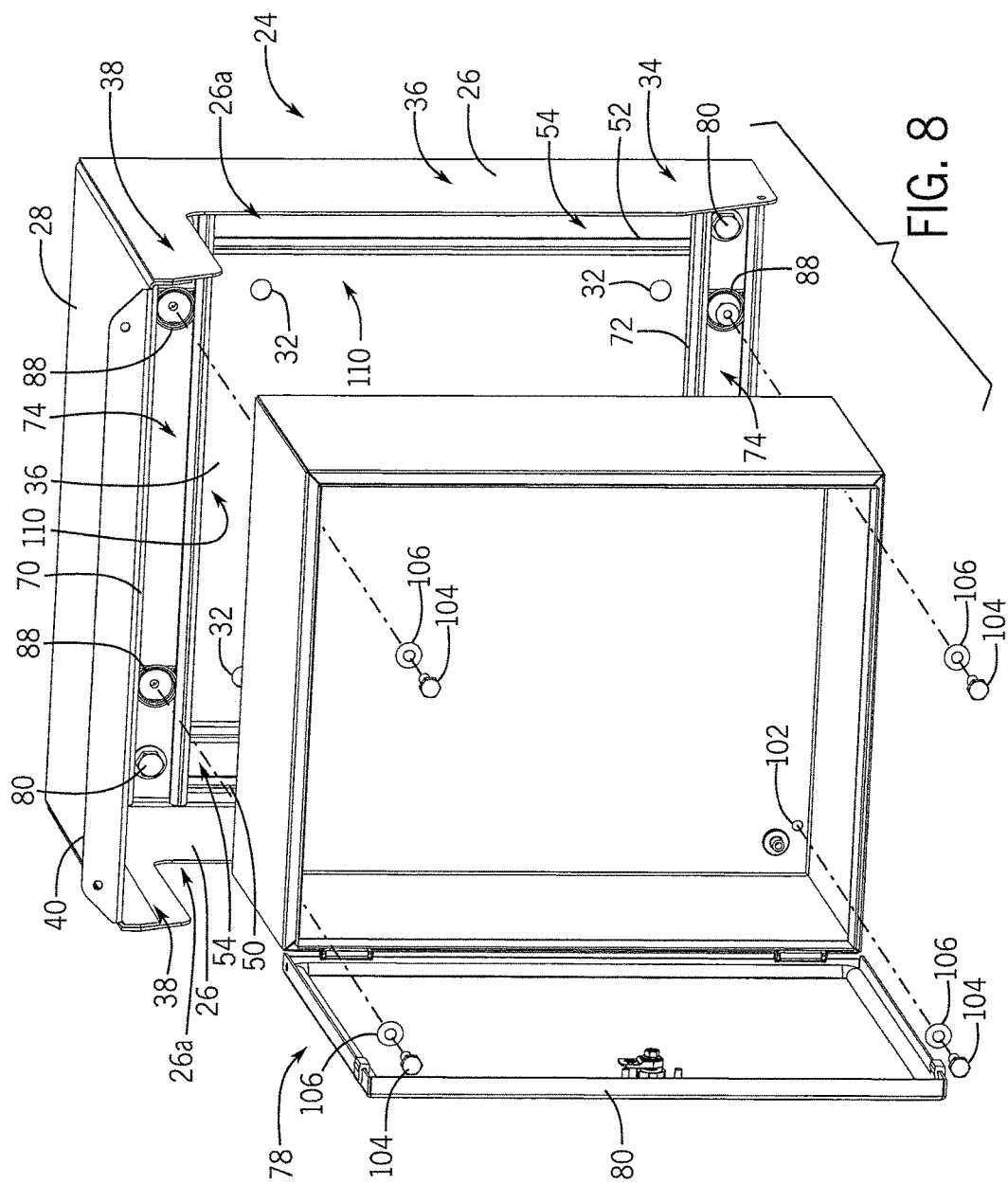
FIG. 8 is an front, top, right isometric view of the shield body of FIG. 1, illustrating another enclosure being secured to the shield body.

FIG. 8 illustrates the use of the mounting members 50, 52, 70, and 72, and the nuts 66 and 88 to mount of a differently configured enclosure 100 to the shield body 24. As generally described above, the mounting members 50 and 52 can be secured to the shield body 24 in an appropriate configuration, the mounting members 70 and 72 secured to the mounting members 50 and 52 with an appropriate vertical spacing, and then the nuts 88 positioned in the mounting members 70 and 72 to be generally aligned with mounting holes 102 (some not shown) on the enclosure 100. The enclosure 100 can then be moved into the interior of the shield body 24 and fasteners, such as screws 104, can be inserted through the mounting holes 102 (and washers 106) to engage the nuts 88. Tightening the screws 104 can then rigidly, but removably, secure the enclosure 100 to the shield body 24, with the rear panel 30, the side panels 26, the top panel 28 and the lip 40 shielding the enclosure 100.

The illustrated arrangement can provide other benefits, in addition to accommodating the particular mounting configuration of the enclosure 100 (e.g., the arrangement of the mounting holes 102). For example, the cut-out 26a provided in the side panel 26 can allow a door 108 of the enclosure 100 to swing open without substantial interference from the shield body 24. Further, due to the thickness and mounting arrangement of the mounting members 50, 52, 72 and 74, as well as the geometry of the shield body 24 and the enclosure 100, air gaps 110 are provided between the shield body 24 and the enclosure 100. This may provide additional thermal protection, including due to the circulation of air within the air gaps 110 to cool the enclosure 100 and the shield body 24.

Figure 9:
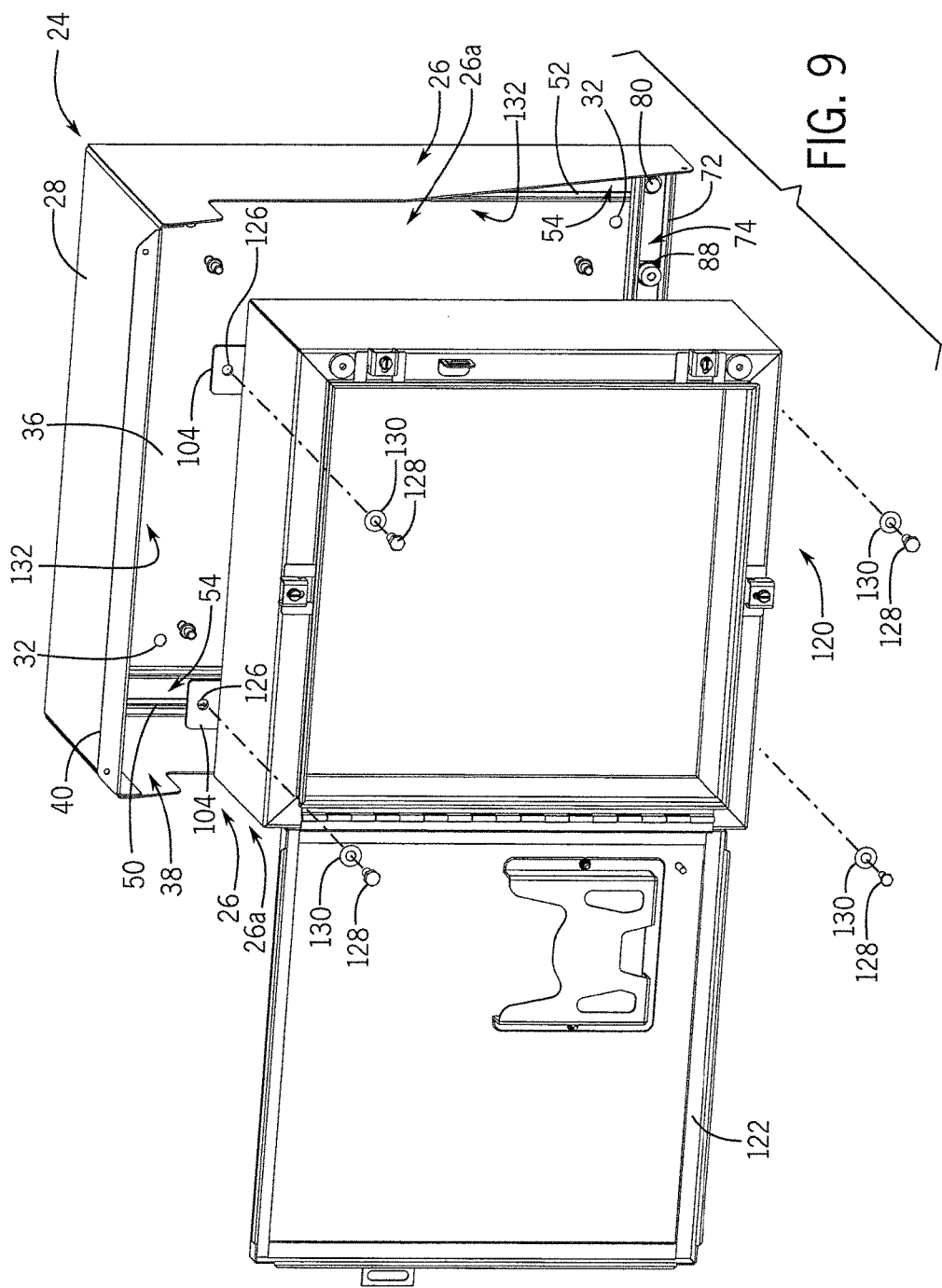
FIG. 9 is a front, top, right isometric view of the shield body of FIG. 1, illustrating still another enclosure being secured to the shield body.

FIG. 9 illustrates the mounting of an enclosure 120 with a door 122 and mounting feet 124 to the shield body 24. The enclosure 120 can be mounted in a similar manner as the enclosure 100, as described above, with the mounting members 50 and 52, the nuts 66, the mounting members 70 and 72, and the nuts 88 being adjusted to generally dispose the nuts 88 to cooperate with the mounting holes 126. Screws 128 and washers 130 can then be used to rigidly, but removably, secure the enclosure 120 to the shield body 24, with the rear panel 30, the side panels 26, the top panel 28 and the lip 40 shielding the enclosure 100, and providing air gaps 132 between the enclosure 120 and the shield body 24. Further, the cut-out 26a provided in the side panel 26 can allow the door 122 to swing open without substantial interference from the shield body 24.

As also illustrated in FIG. 9, in some embodiments, the mounting holes 32 on the shield body 24 are disposed on the rear panel 30 so that when the enclosure 120 is secured to the shield body 24, the mounting holes 32 are slightly to the side of the enclosure 120 and can be accessed from the front of the assembly. Accordingly, a worker can secure the enclosure 120 to the shield body 24 before or after installing the shield body 24 on a wall or other structure.

In contrast, as illustrated in FIG. 8, the enclosure 100 (along with the mounting members 70 and 72) generally covers the mounting holes 32 when secured to the shielding arrangement 20. Accordingly, it may sometimes be necessary to install the shielding arrangement 20 on a wall or frame before securing the enclosure 100 to the shielding arrangement 20. In some embodiments, this kind of arrangement can be utilized as a positive security feature to prevent unwanted tampering with an installation.

In some embodiments, different numbers of mounting members can be used for a shielding arrangement. In some embodiments, only two mounting members may be used. For example, two mounting members similar to the mounting members 50 and 52 can be rigidly secured (e.g., welded) to a shield body with generally vertical orientations and with a horizontal spacing between the mounting members that is similar to a horizontal spacing between mounting holes (or other mounting features) on an enclosure. Fasteners similar to the nuts 66 or 88 can then be positioned on the mounting members with a vertical spacing that is similar to the vertical spacing between the mounting holes on the enclosure. The enclosure can then be secured to the shield body using the fasteners and the two mounting members.

Similarly, two members otherwise similar to the mounting members 50 and 52 can be rigidly secured to the shield body with a generally horizontal orientation and with a vertical spacing between the mounting members that is similar to a vertical spacing between mounting holes (or other mounting features) on an enclosure. Fasteners similar to the nuts 66 or 88 can then be positioned on the mounting members with a horizontal spacing that is similar to the horizontal spacing between the mounting holes on the enclosure. The enclosure can then be secured to the shield body using the fasteners and the two mounting members.

As another example, multiple mounting members can be used simultaneously to secure multiple enclosures to a single shield body. For example, where a vertical height of a shield body is large enough to accommodate two (or more) enclosures, relatively long mounting members can be secured to the shield body in a vertical orientation, and four mounting members can be secured to the relatively long mounting members in a horizontal orientation. A first enclosure can then be secured to the top two horizontally arranged mounting members and a second enclosure can be secured to the bottom two horizontally arranged mounting members.

In some embodiments, a different number of mounting members can be used to secure multiple enclosures. For example, where a lower enclosure has upwardly extending mounting feet (e.g., similar to the mounting feet 124) that exhibit a horizontal spacing that is larger than an upper enclosure, three horizontal mounting members can be used. In such an arrangement, for example, the upper enclosure can be secured to the top and middle horizontal mounting members, and the lower enclosure can be secured to the middle and bottom horizontal mounting members, with the upper enclosure generally disposed between the mounting feet of the lower enclosure. A similar arrangement can also be used, with mounting features of the upper and lower enclosures otherwise horizontally offset from each other.

Figure 10A:
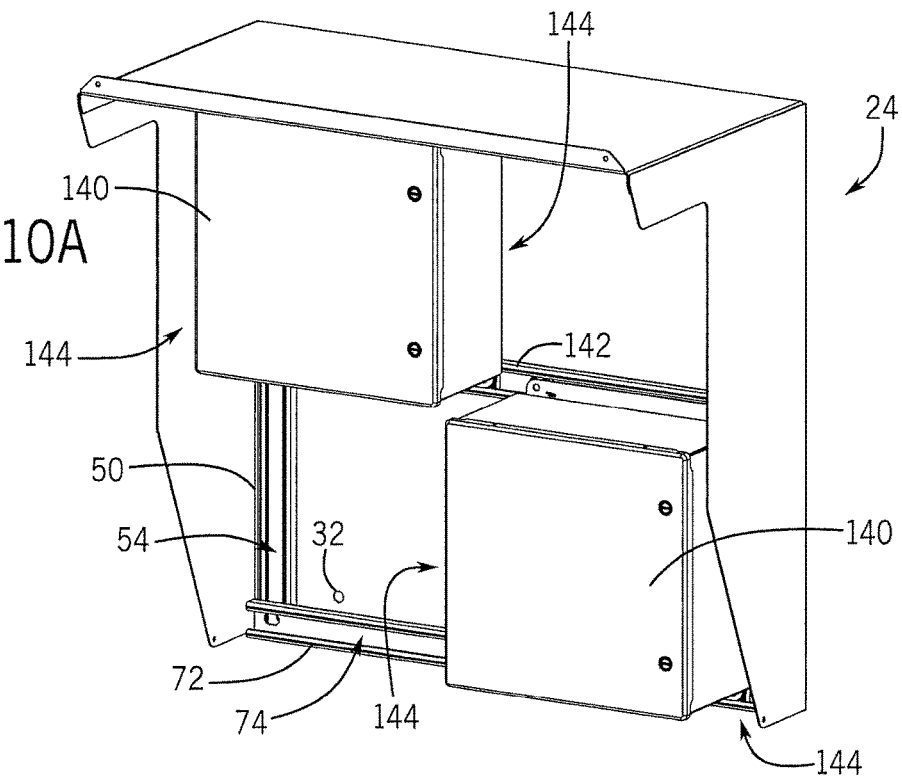
FIGS. 10A and 10B are front, top, right isometric and front elevation views, respectively, of the of shield body of FIG. 1, with multiple enclosures secured thereto.
Figure 10B:
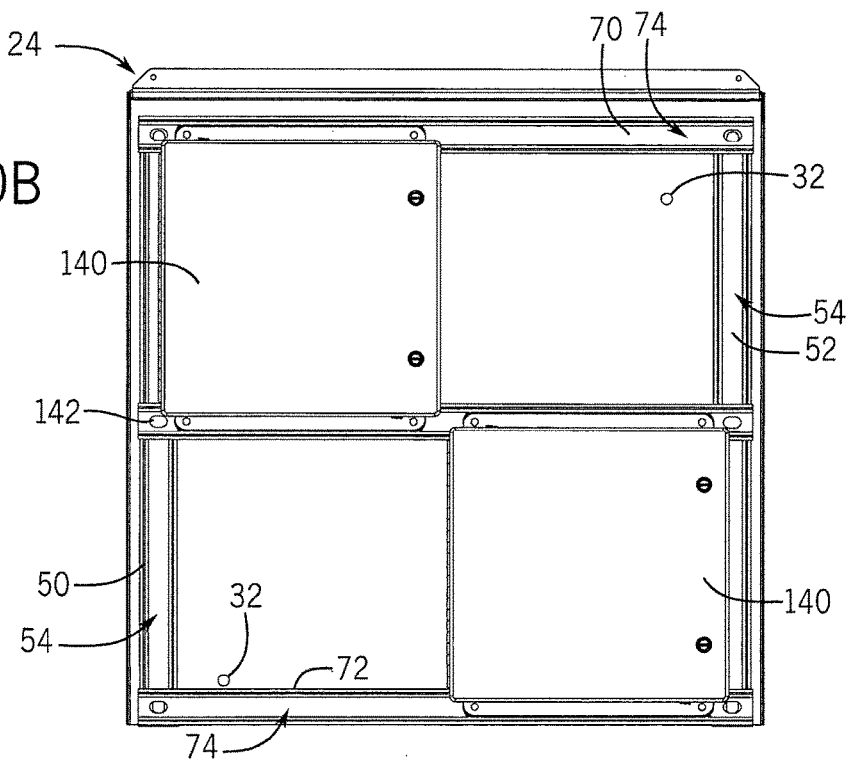

As another example, as illustrated in FIGS. 10A and 10B, multiple smaller enclosures 140 can be secured to the shield body 24 in a vertically overlapping configuration. In addition to the mounting members 70 and 72, for example, an additional (e.g., interchangeable) mounting member 142 can be secured to the mounting members 50 and 52, with the mounting member 142 being generally disposed between the mounting members 70 and 72. Fasteners (not shown in FIGS. 10A and 10B), such as the nuts 88 (see, e.g., FIG. 8), can then be used to attach a first of the enclosures 140 to the mounting members 62 and 142, and to attach a second of the enclosures 140 to the mounting members 142 and 64. In this way, for example, through the use of five mounting members 50, 52, 70, 72 and 142, the two enclosures 140 can be separately and customizably secured to the single shield body 24. Further, as with various configurations discussed above, air gaps 144 can be provided between the enclosures 140 and the shield body 24, in order to provide additional thermal protection for the enclosures 140.

As also noted above, in some embodiments the disclosed shielding arrangement can be configured to be mounted to a pole, instead of (or in addition to) other support structures. FIG. 11 illustrates an example configuration for such a pole-mounted arrangement, in which rear mounting members 150 for the shield body 24 include respective sets of attachment slots 152 and respective mounting channels 154. A set of the nuts 66 (or other fasteners) can be inserted into the mounting channels 154 and retained therein in general alignment with the mounting holes 32 on the rear panel 30 of the shield body 24. Additional fasteners (e.g., various screws) can then be advanced through the mounting holes 32 and the nuts 66 to secure the mounting members 150 to outside of the shield body 24. Angled mounting brackets 156 adapted for attachment to a pole (not shown) and secured to the mounting members 150 (e.g., using the attachment slots 152) can accordingly be used to attach the entire shield body 24 (and any enclosures secured thereto) to the pole.

The examples above generally describe shielding arrangements that can allow a single shield body to be secured to a variety of enclosures, including multiple enclosures at once. It will be understood, in this regard, that the particular configuration of the shield body 24 is presented as an example only. In other embodiments, the disclosed shielding arrangement can allow other shield bodies to be used to different enclosures, including with multiple enclosures at once.

Accordingly, the disclosed shielding arrangement can provide various benefits over existing shielding arrangements. For example, the disclosed shielding arrangement can be easily customized to accommodate a variety of different mounting configurations for a variety of different enclosures. Further, in addition to helping secure a shield body to a variety of different individual enclosures, the disclosed shielding arrangement can help to secure multiple enclosures to a single shield body.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. An apparatus for selectively mounting a shield body to one or more enclosures drawn from a group including a first enclosure with first mounting features, and a second enclosure with second mounting features, the apparatus comprising:
   the shield body;
   a plurality of mounting members, including a first base member attachable to the shield body, a second base member attachable to the shield body, a first crossing member, and a second crossing member;
   first base-member fasteners slidably received by the first base member to couple the first crossing member and the second crossing member to the first base member;
   second base-member fasteners slidably received by the second base member to couple the first crossing member and the second crossing member to the second base member;
   first crossing-member fasteners slidably received by the first crossing member; and
   second crossing-member fasteners slidably received by the second crossing member;
   the first and second base-member fasteners being selectively positionable along the first and second base members, respectively, and the first and second crossing-member fasteners being selectively positionable along the first and second crossing members, respectively, to form:
      a first arrangement in which the first and second crossing-member fasteners are positioned to secure the apparatus to the first mounting features; and
      a second arrangement, different from the first arrangement, in which the first and second crossing-member fasteners are positioned to secure the apparatus to the second mounting features; and
   the shield body being configured such that, when the apparatus is secured to at least one of the first enclosure and the second enclosure, at least one of:
      a rear wall of the shield body extends below a lower edge of the at least one of the first enclosure and the second enclosure; and
      a top wall of the shield body extends forwardly past a front edge of the at least one of the first enclosure and the second enclosure.

2. The apparatus of claim 1, further comprising:
   a third crossing member;
   wherein the first base-member fasteners further couple the third crossing member to the first base member between the first crossing member and the second crossing member;
   wherein the second base-member fasteners further couple the third crossing member to the second base member between the first crossing member and the second crossing member; and
   wherein the third crossing member slidably receives third crossing-member fasteners that are selectively positionable along the third crossing member to secure the apparatus to at least one of the first mounting features and the second mounting features.

3. The apparatus of claim 2, wherein the apparatus is secured to the first mounting features by the first and third crossing-member fasteners; and
   wherein the apparatus is secured to the second mounting features by the second and third crossing-member fasteners.

4. The apparatus of claim 1, wherein each mounting member of the plurality of mounting members includes a respective channel to slidably receive and retain at least one of the first base-member fasteners, the second base-member fasteners, the first crossing-member fasteners, and the second crossing-member fasteners.

5. The apparatus of claim 4, wherein each of first base-member fasteners, the second base-member fasteners, the first crossing-member fasteners, and the second crossing-member fasteners includes a respective nut and a respective biasing element to secure the respective nut within the respective channel of the respective mounting member.

6. The apparatus of claim 5, wherein each of the respective channels exhibits a respective cross-sectional profile; and
   wherein the respective cross-sectional profiles are substantially identical to each other.

7. The apparatus of claim 1, wherein a forward end of the top wall of the shield body includes an upwardly extending lip.

8. The apparatus of claim 7, wherein the top wall angles downwardly from a perspective moving away from the upwardly extending lip towards a rear wall of the shield body.

9. An apparatus to secure a shield body to one or more enclosures drawn from a group including a first enclosure with first mounting features, and a second enclosure with second mounting features, the apparatus comprising:
  a plurality of mounting members, each mounting member of the plurality of mounting members being configured to retain respective fasteners at any of a respective plurality of locations along the mounting member;
  a first set of the mounting members being secured to a second set of the mounting members using a first set of the fasteners retained by the first set of the mounting members;
  the second set of the mounting members retaining a second set of the fasteners;
  a first arrangement of the first set of the fasteners and of the second set of the fasteners, relative to the first set of the mounting members and the second set of the mounting members, respectively, disposing the second set of the fasteners to secure the apparatus to the first mounting features; and
  a second arrangement of the first set of the fasteners and of the second set of the fasteners, relative to the first set of the mounting members and the second set of the mounting members, respectively, disposing the second set of the fasteners to secure the apparatus to the second mounting features,
  wherein the first set of the mounting members is rigidly secured to a rear wall of the shield body.

10. The apparatus of claim 9, wherein the first arrangement of the first set of the fasteners and of the second set of the fasteners is different from the second arrangement of the first set of the fasteners and of the second set of the fasteners.

11. The apparatus of claim 9, wherein the first set of the mounting members includes two of the mounting members, and the second set of the mounting members includes two of the mounting members.

12. The apparatus of claim 11, wherein the second set of the mounting members includes three of the mounting members, including a first end member, a second end member, and an intermediary member; and
  wherein the first mounting features are secured to the first end member and to the intermediary member, and the second mounting features are secured to the intermediary member and the second end member.

13. The apparatus of claim 9, with the fasteners include spring-biased nuts, wherein each mounting member of the plurality of mounting members includes a respective channel configured to slidably receive at least one of the spring-biased nuts.

14. The apparatus of claim 13, wherein the plurality of mounting members is a plurality of interchangeable mounting members.

15. The apparatus of claim 9, wherein at least one mounting member of the second set of the mounting members is spaced apart from the rear wall of the shield body to provide an air-flow gap between the rear wall of the shield body and at least one of the first enclosure and the second enclosure.

16. A method of securing a shield body to an enclosure, using an apparatus that includes a first set of mounting members, a second set of mounting members, a first set of fasteners, and a second set of fasteners, each mounting member of the first set of mounting members and the second set of mounting members being configured to retain respective fasteners at any of a respective plurality of locations along the mounting member, the method comprising:
  securing the first set of mounting members to the shield body;
  retaining the first set of fasteners at select locations along at least one mounting member of the first set of mounting members to provide a first fastener arrangement;
  securing the second set of mounting members to the first set of mounting members using the first set of fasteners in the first fastener arrangement;
  retaining the second set of fasteners at select locations along at least one mounting member of the second set of mounting members to provide a second fastener arrangement; and
  securing the second set of mounting members to the enclosure using the second set of fasteners in the second fastener arrangement.

* * * * *